United States Patent
Saito et al.

(10) Patent No.: US 8,505,928 B2
(45) Date of Patent: Aug. 13, 2013

(54) SUBSTRATE TEMPERATURE CONTROL FIXING APPARATUS

(75) Inventors: Miki Saito, Nagano (JP); Tadayoshi Yoshikawa, Nagano (JP); Koki Tamagawa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 904 days.

(21) Appl. No.: 12/643,472

(22) Filed: Dec. 21, 2009

(65) Prior Publication Data

US 2010/0156055 A1 Jun. 24, 2010

(30) Foreign Application Priority Data

Dec. 24, 2008 (JP) ................ P.2008-328255

(51) Int. Cl.
*B23B 31/28* (2006.01)
(52) U.S. Cl.
USPC ............ 279/128; 156/345.52; 361/234
(58) Field of Classification Search
USPC ............ 279/128; 156/345.52; 361/234
See application file for complete search history.

(56) References Cited

U.S. PATENT DOCUMENTS

| | | | | |
|---|---|---|---|---|
| 5,535,090 A | * | 7/1996 | Sherman | 361/234 |
| 5,867,359 A | * | 2/1999 | Sherman | 361/234 |
| 5,880,924 A | * | 3/1999 | Kumar et al. | 361/234 |
| 6,444,957 B1 | * | 9/2002 | Kitagawa et al. | 219/444.1 |
| 6,888,236 B2 | * | 5/2005 | Hiramatsu et al. | 257/703 |
| 7,044,399 B2 | * | 5/2006 | Goto et al. | 237/76 |
| 7,071,551 B2 | * | 7/2006 | Hiramatsu et al. | 257/710 |
| 7,218,503 B2 | * | 5/2007 | Howald | 361/234 |
| 7,651,571 B2 | | 1/2010 | Migita | |
| 7,837,828 B2 | * | 11/2010 | Ikeda et al. | 156/345.53 |
| 2002/0036881 A1 | * | 3/2002 | Shamouilian et al. | 361/234 |
| 2006/0144516 A1 | * | 7/2006 | Ricci et al. | 156/345.27 |
| 2006/0175772 A1 | | 8/2006 | Nozawa | |

FOREIGN PATENT DOCUMENTS

| | | |
|---|---|---|
| JP | 07-240382 | 9/1995 |
| JP | 2006-080389 | 3/2006 |
| JP | 2007-194616 | 8/2007 |
| WO | 2004/084298 | 9/2004 |

* cited by examiner

*Primary Examiner* — Eric A Gates
(74) *Attorney, Agent, or Firm* — Drinker Biddle & Reath LLP

(57) ABSTRACT

A substrate temperature control fixing apparatus comprises an electrostatic chuck which includes a base body and adsorbs and holds an adsorbing target mounted on one of surfaces of the base body, a base plate which supports the electrostatic chuck, and a bank portion provided on an outer periphery of one of surfaces of the base plate which is opposed to the other of the surfaces of the base body.

7 Claims, 2 Drawing Sheets

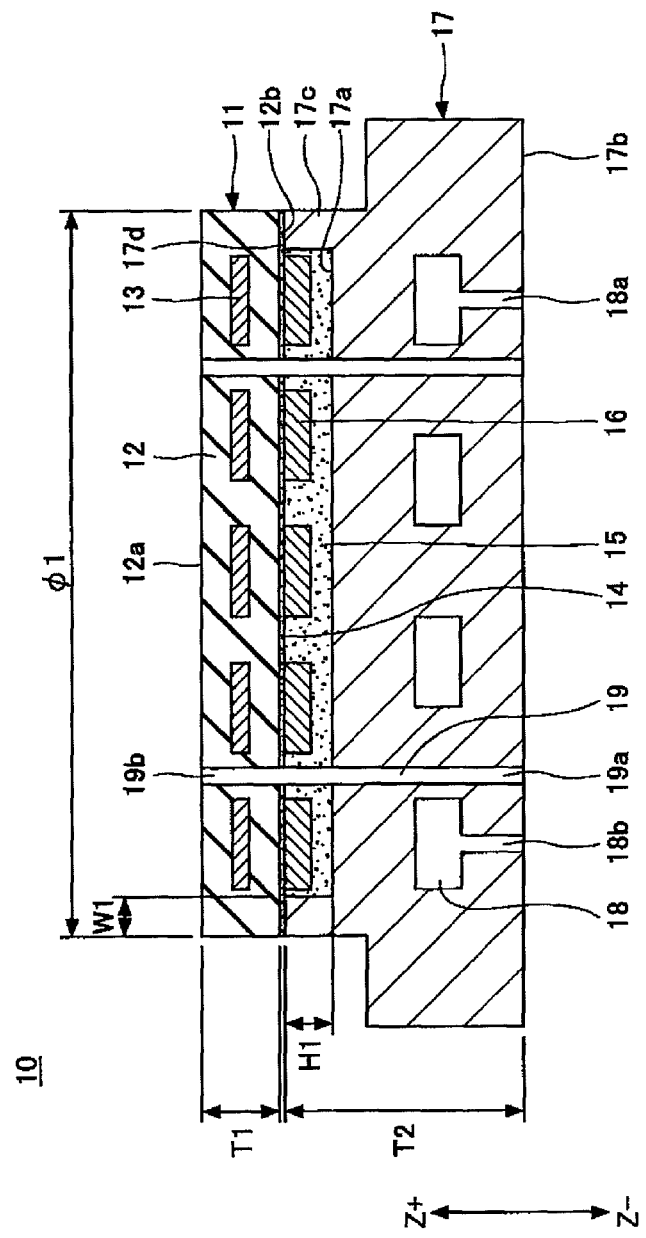

SUBSTRATE TEMPERATURE CONTROL FIXING APPARATUS

This application claims priority to Japanese Patent Application No. 2008-328255, filed Dec. 24, 2008, in the Japanese Patent Office. The Japanese Patent Application No. 2008-328255 is incorporated by reference in its entirety.

TECHNICAL FIELD

The present disclosure relates to a substrate temperature control fixing apparatus having an electrostatic chuck for adsorbing an adsorbing target mounted on its base body.

RELATED ART

A film forming apparatus (for example, a CVD apparatus or a PVD apparatus) or a plasma etching apparatus which is to be used in a manufacture of a semiconductor device such as an IC or an LSI has a stage for holding a substrate (for example, a silicon wafer) in a vacuum processing chamber with high precision. As the stage, a substrate temperature control fixing apparatus having an electrostatic chuck has been proposed, for example.

The substrate temperature control fixing apparatus serves to adsorb and hold a substrate through the electrostatic chuck and to control a temperature in such a manner that the substrate thus adsorbed and held is set into a predetermined temperature. The electrostatic chuck includes a Coulomb force type electrostatic chuck and a Johnson-Rahbek force type electrostatic chuck. The Coulomb force type electrostatic chuck has a feature that a high responsiveness to an application of a voltage for an adsorbing force can be given. However, in the Coulomb force type electrostatic chuck, an application of a high voltage is required and a contact area of the electrostatic chuck and the substrate should be increased in order to obtain a sufficient adsorbing force. The Johnson-Rahbek force type electrostatic chuck has a feature that a current is required to flow to the substrate. However, in the Johnson-Rahbek force type electrostatic chuck, a sufficient adsorbing force can be obtained even if the contact area of the electrostatic chuck and the substrate is small.

FIG. 1 is a sectional view simply showing an example of a related-art substrate temperature control fixing apparatus. With reference to FIG. 1, a substrate temperature control fixing apparatus 100 has an electrostatic chuck 101, a bonding layer 104, a bonding layer 105, a heating unit 106, a base plate 107 and a protective layer 108.

The electrostatic chuck 101 has a base body 102 and an electrostatic electrode 103. The base body 102 is fixed onto the base plate 107 through the bonding layers 104 and 105. A material of the base body 102 is ceramics, for example. Materials of the bonding layers 104 and 105 contain silicon, for example.

The electrostatic electrode 103 is a thin film electrostatic electrode and is provided in the base body 102. The electrostatic electrode 103 is connected to a DC power supply (not shown) provided on an outside of the substrate temperature control fixing apparatus 100. When a predetermined voltage is applied, an adsorbing target (not shown) such as a substrate is adsorbed and held onto an upper surface 102a of the base body 102. An adsorbing and holding force is increased when the voltage applied to the electrostatic electrode 103 is raised.

The heating unit 106 is provided on the base plate 107 so as to be interposed between the bonding layers 104 and 105. The heating unit 106 generates a heat by an application of a voltage and controls a temperature of the base body 102 through the bonding layer 104. The base plate 107 is a member for supporting the electrostatic chuck 101. A material of the base plate 107 is Al, for example.

The protective layer 108 is provided circularly to surround side surfaces of the bonding layers 104 and 105 in such a manner that the bonding layers 104 and 105 are not exposed to the outside of the substrate temperature control fixing apparatus 100. In the case in which the substrate temperature control fixing apparatus 100 is used in a plasma and the side surfaces of the bonding layers 104 and 105 are exposed to the outside of the substrate temperature control fixing apparatus 100, the side surfaces of the bonding layers 104 and 105 are exposed to the plasma and are thus corroded because silicon contained in the bonding layers 104 and 105 has a low resistance to the plasma. When the bonding layers 104 and 105 are corroded, a particle is generated so that the substrate adsorbed and held onto the upper surface 102a of the base body 102 is contaminated with the particle. The protective layer 108 is provided for preventing the side surfaces of the bonding layers 104 and 105 from being exposed to the plasma. The protective layer 108 is formed by an epoxy based resin, for example.

[Patent Document 1] International Laid-Open No. 2004/084298

However, the epoxy based resin contained in the protective layer 108 has a higher resistance to the plasma than the silicon but does not have a sufficiently high resistance to the plasma. For this reason, there is a problem in that the epoxy based resin contained in the protective layer 108 is gradually deteriorated and the particle is generated from the protective layer 108 itself when the substrate temperature control fixing apparatus 100 is used in the plasma.

SUMMARY

Exemplary embodiments of the present invention provide a substrate temperature control fixing apparatus capable of reducing a generation of a particle.

A substrate temperature control fixing apparatus according to an exemplary embodiment of the invention comprises:

an electrostatic chuck which includes a base body and adsorbs and holds an adsorbing target mounted on one of surfaces of the base body;

a base plate which supports the electrostatic chuck; and a bank portion provided on an outer periphery of one of surfaces of the base plate which is opposed to the other of the surfaces of the base body.

It is possible to provide a substrate temperature control fixing apparatus capable of reducing a generation of a particle.

Other features and advantages may be apparent from the following detailed description, the accompanying drawings and the claims.

BRIEF DESCRIPTION OF THE DRAWINGS

FIG. 2 is a sectional view simply showing an example of a substrate temperature control fixing apparatus according to the embodiment.

DETAILED DESCRIPTION

Figure 1:
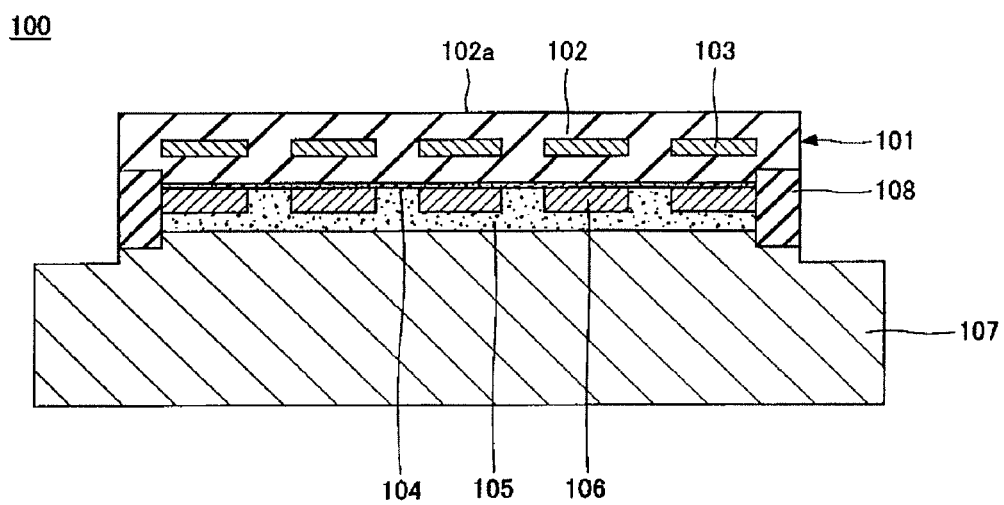
FIG. 1 is a sectional view simply showing an example of a related-art substrate temperature control fixing apparatus.

An exemplary embodiment will be described below with reference to the drawings.

FIG. 2 is a sectional view simply showing an example of a substrate temperature control fixing apparatus according to the embodiment. With reference to FIG. 2, a substrate temperature control fixing apparatus 10 has an electrostatic chuck 11, a bonding layer 14, a bonding layer 15, a heating unit 16, and a base plate 17.

The electrostatic chuck 11 has a base body 12 and an electrostatic electrode 13. The base body 12 is a dielectric and takes a cylindrical shape (a circular shape seen on a plane), for example. Herein, the meaning of the term "seen on the plane" is that a target is seen in a Z+ or Z− direction of FIG. 2 (a vertical direction of the base body 12 (and so forth). For the base body 12, it is possible to use ceramics such as $Al_2O_3$ or MN. In the case in which the base body 12 takes the cylindrical shape, a diameter $\phi 1$ can be set to be six inches (approximately 150 mm), eight inches (approximately 200 mm) and 12 inches (approximately 300 mm), for example. A thickness T1 of the base body 12 can be set to be 3 to 20 mm, for example. A dielectric constant (1 KHz) of the base body 12 can be set to be 9 to 10, for example. A volume resistivity of the base body 12 can be set to be $10^{12}$ to $10^{16}$ $\Omega$m, for example.

The base body 12 has an upper surface 12a and a lower surface 12b. For convenience, the Z+ and Z− directions in FIG. 2 indicate upward and downward directions respectively (and so forth). The upper surface 12a of the base body 12 is a surface on which an adsorbing target (not shown) such as a substrate abuts. A plurality of protruded portions taking a cylindrical shape (a circular shape seen on the plane) and having a diameter of approximately 0.1 to 0.2 mm may be provided to be scattered like polka dots seen on the plane over the upper surface 12a of the base body 12, for example.

The electrostatic electrode 13 is a thin film electrostatic electrode and is provided in the base body 12. The electrostatic electrode 13 is connected to a DC power supply (not shown) provided on an outside of the substrate temperature control fixing apparatus 10 and generates a Coulomb force together with the adsorbing target (not shown) such as the substrate when a predetermined voltage is applied, and adsorbs and holds the adsorbing target (not shown) onto the upper surface 12a of the base body 12. An adsorbing and holding force is increased when the voltage applied to the electrostatic electrode 13 is raised. The electrostatic electrode 13 may take a monopolar or bipolar shape. As a material of the electrostatic electrode 13, it is possible to use tungsten or molybdenum, for example.

The heating unit 16 is fixed between the bonding layer 14 and the bonding layer 15, and furthermore, the lower surface 12b of the base body 12 is fixed onto a bank portion 17c of the base plate 17 which will be described below. A thickness of the bonding layer 14 can be set to be 0.1 to 0.5 mm, for example. A thickness of the bonding layer 15 can be set to be 0.5 to 2.0 mm, for example. As materials of the bonding layers 14 and 15, it is possible to use an adhesive containing silicon, for example.

By setting the thickness of the bonding layer 15 to be greater than that of the bonding layer 14, it is possible to transmit a heat generated in the heating unit 16 to the base plate 17 with difficulty. In other words, the heat generated in the heating unit 16 can be prevented from being radiated through the base plate 17. Thus, the base body 12 can be heated efficiently.

The heating unit 16 is provided on an inside of the bank portion 17c of the base plate 17 which will be described below so as to be interposed between the bonding layers 14 and 15.

The heating unit 16 generates a heat by an application of a voltage and controls a temperature of the base body 12 through the bonding layer 14.

The base plate 17 is a member for supporting the electrostatic chuck 11. The base plate 17 has an upper surface 17a and a lower surface 17b. As a material of the base plate 17, it is possible to use aluminum, for example. A thickness T2 of the base plate 17 can be set to be 20 to 50 mm, for example.

The bank portion 17c is provided on an outer periphery of the upper surface 17a of the base plate 17. The bank portion 17c takes an annular shape seen on a plane, for example. A height H1 of the bank portion 17c can be set to be 1.5 to 5.0 mm, for example. A width W1 of the bank portion 17c can be set to be 1.5 to 2.5 mm, for example. The base plate 17 is provided with a water path 18 and a gas path 19 and controls a temperature of the base body 12. It is not necessary to always provide the water path 18 and the gas path 19 in the base plate 17.

Thus, the bank portion 17c taking the annular shape seen on the plane is provided on the outer periphery of the upper surface 17a of the base plate 17, for example. Consequently, it is not necessary to provide a protective layer on side surfaces of the bonding layers 14 and 15 differently from the related art. The reason is that the bonding layer 15 formed comparatively thickly can be prevented from being exposed to the outside of the substrate temperature control fixing apparatus 10. The side surface of the bonding layer 14 is exposed to the outside of the substrate temperature control fixing apparatus 10. However, the bonding layer 14 is formed comparatively thinly. Therefore, it is possible to minimize the exposure of the bonding layer. As a result, it is possible to reduce a generation of a particle in the case in which the substrate temperature control fixing apparatus 10 is used in a plasma.

An example of a method of forming the bonding layers 14 and 15 will be described below. First of all, a silicon adhesive to be the bonding layer 14 is applied to the lower surface 12b of the base body 12, and the heating unit 16 is disposed on the silicon adhesive thus applied. Moreover, a silicon adhesive to be the bonding layer 15 is applied to an inside of the bank portion 17c of the base plate 17. Then, the base body 12 is disposed on the base plate 17 in such a manner that the lower surface 12b of the base body 12 is opposed to an upper surface 17d of the bank portion 17c, and the silicon adhesive is thus cured. Consequently, the bonding layers 14 and 15 are formed so that the base body 12 is fixed onto the base plate 17, and furthermore, the heating unit 16 is fixed to the inside of the bank portion 17c of the base plate 17 so as to be interposed between the bonding layers 14 and 15.

Although the upper surface 17d of the bank portion 17c and the lower surface 12b of the base body 12 are fixed to each other through the bonding layer 14, the bonding layer 14 is used for fixing the heating unit 16 and it is not necessary to provide a new bonding layer in order to fix the upper surface 17d of the bank portion 17c and the lower surface 12b of the base body 12 to each other.

The water path 18 has a cooling water introducing portion 18a and a cooling water discharging portion 18b which are formed on the lower surface 17b of the base plate 17. The cooling water introducing portion 18a and the cooling water discharging portion 18b are connected to a cooling water control device (not shown) which is provided on the outside of the substrate temperature control fixing apparatus 10. The cooling water control device (not shown) introduces cooling water from the cooling water introducing portion 18a into the water path 18 and discharges the cooling water from the cooling water discharging portion 18b. The cooling water is circulated to cool the base plate 17 so that the base body 12 is cooled through the bonding layers 14 and 15.

The gas path 19 penetrating the base body 12, the bonding layers 14 and 15 and the base plate 17 is formed thereon. The gas path 19 has a plurality of gas introducing portions 19a formed on the lower surface 17b of the base plate 17 and a plurality of gas discharging portions 19b formed on the upper surface 12a of the base body 12. The gas introducing portions 19a are connected to a gas pressure control device (not shown) which is provided on the outside of the substrate temperature control fixing apparatus 10. The gas pressure control device (not shown) can vary a pressure of an inert gas within a range of 0 to 50 Torr, for example, and can introduce the inert gas from the gas introducing portion 19a into the gas path 19.

The inert gas thus introduced is discharged from the gas discharging portion 19b and is filled between a lower surface of an adsorbing target (not shown) such as a substrate mounted on the upper surface 12a of the base body 12 and the upper surface 12a of the base body 12. Consequently, it is possible to enhance a thermal conductivity between the base body 12 and the adsorbing target (not shown). As the inert gas, it is possible to use He or Ar, for example.

According to the substrate temperature control fixing apparatus 10 in accordance with the embodiment, the bank portion 17c taking the annular shape seen on the plane is provided on the outer periphery of the upper surface 17a of the base plate 17, for example. Even if the protective layer is not provided on the side surfaces of the bonding layers 14 and 15 differently from the related art, consequently, it is possible to reduce the generation of the particle when the substrate temperature control fixing apparatus 10 is used in the plasma. Thus, it is possible to prevent the adsorbing target such as the substrate from being contaminated with the particle.

Although the preferred embodiment has been described above in detail, the invention is not restricted to the embodiment but various modifications and replacements can be added to the embodiment without departing from the scope described in the claims.

For example, the bank portion 17e does not need to be formed integrally with the base plate 17 but the bank portion 17c taking the annular shape seen on the plane may be bonded to the outer periphery of the upper surface 17a of the base plate 17 through electron beam welding. The electron beam welding represents a method of heating a filament (a cathode) in a high vacuum, accelerating a discharged electron at a high voltage and focusing the electron by means of an electromagnetic coil, and causing the electron to collide with a welded portion and converting a kinetic energy of an electron beam into a thermal energy, thereby carrying out welding.

What is claimed is:

1. A substrate temperature control fixing apparatus comprising:
   an electrostatic chuck which includes a base body and adsorbs and holds an adsorbing target mounted on an upper surface of the base body;
   a base plate which supports the electrostatic chuck;
   a bank portion provided on an outer periphery of an upper surface of the base plate which is opposed to a lower surface of the base body; and
   a heating unit provided on an inside of the bank portion, wherein
   a surface of the bank portion which is faced to the lower surface of the base body and the lower surface of the base body are fixed to each other through a first bonding layer,
   the heating unit is fixed to the lower surface of the base body through the first bonding layer, and
   the surface at the first bonding layer side of the heating unit and the surface at the first bonding layer side of the bank portion form a coplanar surface.

2. The substrate temperature control fixing apparatus according to claim 1, wherein the bank portion takes an annular shape.

3. The substrate temperature control fixing apparatus according to claim 1, wherein the heating unit is interposed and fixed between the first bonding layer and a second bonding layer formed on the inside of the bank portion.

4. The substrate temperature control fixing apparatus according to claim 3, wherein a thickness of the second bonding layer is greater than that of the first bonding layer.

5. The substrate temperature control fixing apparatus according to claim 1, wherein the bank portion and the base plate are made of the same material.

6. The substrate temperature control fixing apparatus according to claim 5, wherein the bank portion and the base plate are made of aluminum.

7. The substrate temperature control fixing apparatus according to claim 5, wherein the bank portion is formed integrally with the base plate.

\* \* \* \* \*